(12) United States Patent
Takei et al.

(10) Patent No.: US 7,902,642 B2
(45) Date of Patent: Mar. 8, 2011

(54) RESIN COMPOSITION FOR SEALING LIGHT-EMITTING DEVICE AND LAMP

(75) Inventors: Tomoyuki Takei, Ichihara (JP); Yuko Sakata, Tokyo (JP)

(73) Assignee: Showa Denko K.K., Tokyo (JP)

( * ) Notice: Subject to any disclaimer, the term of this patent is extended or adjusted under 35 U.S.C. 154(b) by 171 days.

(21) Appl. No.: 12/374,764

(22) PCT Filed: Dec. 27, 2007

(86) PCT No.: PCT/JP2007/075196
§ 371 (c)(1),
(2), (4) Date: Jan. 22, 2009

(87) PCT Pub. No.: WO2008/081900
PCT Pub. Date: Jul. 10, 2008

(65) Prior Publication Data
US 2010/0006887 A1    Jan. 14, 2010

(30) Foreign Application Priority Data
Dec. 28, 2006   (JP) .................. 2006-356532

(51) Int. Cl.
*H01L 23/58* (2006.01)
(52) U.S. Cl. ...... 257/643; 257/79; 257/88; 257/E21.006; 257/E21.007; 257/E21.053; 257/E21.077; 257/E21.136; 257/E21.263; 257/E21.264; 257/E21.329

(58) Field of Classification Search .................... 257/13, 257/40, 79, 88, 209, 643, E21.006, E21.007, 257/E21.053, E21.077, E21.136, E21.263, 257/E21.264, E21.329
See application file for complete search history.

(56) References Cited

U.S. PATENT DOCUMENTS
2009/0062481 A1* 3/2009 Ito et al. .......................... 525/418
2009/0137774 A1* 5/2009 Ito ................. 528/405
2009/0137775 A1* 5/2009 Ito ................. 528/405

FOREIGN PATENT DOCUMENTS
| JP | 2004-203943 A | 7/2004 |
| JP | 2004-238589 A | 8/2004 |
| JP | 2005-336349 A | 12/2005 |
| JP | 2006-131848 A | 5/2006 |
| JP | 2006-263929 A | 10/2006 |
| JP | 2006-335985 A | 12/2006 |
| JP | 2006-342276 A | 12/2006 |
| JP | 2007-326988 A | 12/2007 |

* cited by examiner

*Primary Examiner* — David Nhu
(74) *Attorney, Agent, or Firm* — Sughrue Mion, PLLC

(57) ABSTRACT

A resin composition for sealing a light-emitting device of the present invention includes a silsesquioxane resin including two or more oxetanyl groups, an aliphatic hydrocarbon including one or more epoxy groups and a cationic polymerization initiator. Furthermore, a lamp of the present invention includes a package equipped with a cup-shaped sealing member, an electrode exposed in the bottom portion of the sealing member, and a light-emitting device arranged on the bottom portion and electrically connected with the electrode, wherein the light-emitting device is sealed with the above-described resin composition for sealing a light-emitting device filled in the sealing member.

5 Claims, 2 Drawing Sheets

RESIN COMPOSITION FOR SEALING
LIGHT-EMITTING DEVICE AND LAMP

TECHNICAL FIELD

The present invention relates to a resin composition for sealing a light-emitting device, which is suitably used for sealing a light-emitting device used in displays, back-light light sources, lightings, signaling units, various types of indicators, and the like, and to a lamp in which a light-emitting device is sealed with the resin composition for sealing a light-emitting device.

Priority is claimed on Japanese Patent Application No. 2006-356532, filed Dec. 28, 2006, the contents of which is incorporated herein by reference.

BACKGROUND ART

A light-emitting diode (which hereafter may also be referred to as "LED") is generally formed by arranging an LED device on the bottom portion of a cup-shaped sealing member in a package, and sealing it with a sealing resin. Conventionally, as an LED sealing resin, a light-transmitting resin including an epoxy resin, a silicone resin, or the like is used.

However, since a bisphenol A glycidyl ether which is a main component of a common epoxy resin has an absorption at wavelengths shorter than about 400 nm, there was a problem in that coloration caused by oxygen oxidation of an aromatic ring under UV excitation occurs. For this reason, a sealing resin composed of an epoxy resin and an LED in which an LED device is sealed with the sealing resin was required to have improved light resistance together with high reliability.

Furthermore, when using a silicone resin such as a polydimethyl silicone, polydiphenyl silicone or polymethylphenyl silicone, a distortion is generated by the difference in thermal expansion between the silicone resin and a metal wire or an electrode of a lead frame which is to be sealed, resulting in the metal wire being broken or the detachment of the sealing resin from the electrode. Furthermore, when using a sealing resin composed of a silicone resin, because the silicone resin is soft and the strength thereof is low, there was a problem in that the surface of the sealing resin easily becomes dusty, and the silicone resin was easily damaged when the LED is mounted. Therefore, the LED in which an LED device is sealed with the sealing resin composed of the silicone resin was not sufficiently reliable.

Furthermore, as a sealing resin used for an LED, a resin including as a main component a siloxane derivative having an epoxy group and oxetanyl group, or having an epoxy group or an oxetanyl group has been proposed (For example, refer to Patent Document 1). By using the sealing resin described in Patent Document 1, the problem caused by using a transparent resin composed of the epoxy resin or silicone resin can be improved.

However, because the sealing resin described in Patent Document 1 has a high viscosity, there were disadvantages in that the droplet of the sealing resin was difficult to discharge by a dispenser and the cracks were not sufficiently prevented while the sealing resin was cured by heating. Accordingly, the productivity and reliability of the LED in which an LED device was sealed with the sealing resin described in Patent Document 1 was insufficient.

[Patent Document 1] Japanese Unexamined Patent Application, First Publication No. 2004-238589

DISCLOSURE OF INVENTION

Problems to be Solved by the Invention

The present invention has been made to address the above-described problems, and an object of which is to provide a resin composition for sealing a light-emitting device, in which the viscosity can be easily adjusted to such a degree that the resin composition is easily discharged by a dispenser, cracks during the curing hardly occur, the surface hardness is high, and the light resistance and adhesion with a metal are excellent.

Furthermore, another object of the present invention is to provide a lamp having an efficient productivity and a high reliability, in which a light-emitting device is sealed with the above-described resin composition for sealing a light-emitting device.

Means for Solving the Problems

The present inventors have studied extensively in order to solve the above-described problems, thereby completing the present invention. The present invention is.
(1) a resin composition for sealing a light-emitting device comprising:
a silsesquioxane resin including two or more oxetanyl groups;
an aliphatic hydrocarbon including one or more epoxy groups; and
a cationic polymerization initiator,
(2) the resin composition for sealing a light-emitting device according to (1), wherein the aliphatic hydrocarbon is included at 10 to 60% by mass,
(3) the resin composition for sealing a light-emitting device according to (1), wherein the aliphatic hydrocarbon includes a cyclohexene oxide group,
(4) the resin composition for sealing a light-emitting device according to (1), wherein the viscosity of the resin composition is in the range of 100 to 5000 mPa·s, and
(5) a lamp comprising a package equipped with a cup-shaped sealing member, an electrode exposed in the bottom portion of the sealing member, and a light-emitting device arranged on the bottom portion and electrically connected with the electrode, wherein the light-emitting device is sealed with the resin composition for sealing a light-emitting device of (1), which is filled in the sealing member.

EFFECTS OF THE INVENTION

According to the resin composition for sealing a light-emitting device of the present invention, there can be provided a resin composition for sealing a light-emitting device, in which the viscosity of the resin composition can be easily adjusted to such a degree that the resin composition is easily discharged by a dispenser, cracks hardly occur during the curing, the surface hardness is high, the light resistance is excellent and the adhesion to metals is excellent.

Further, in the lamp of the present invention, since the light-emitting device is sealed with the above-described resin composition for sealing a light-emitting device, the resin composition is easily discharged by a dispenser to efficiently seal the light-emitting device, thereby providing a lamp with excellent productivity. Furthermore, in the lamp of the present invention, since the light-emitting device is sealed with the resin composition for sealing a light-emitting device of the present invention, which has high surface hardness, excellent light resistance and excellent adhesion to metals, the lamp of the present invention can be provided with a high reliability.

BEST MODE FOR CARRYING OUT THE INVENTION

Figure 1A:
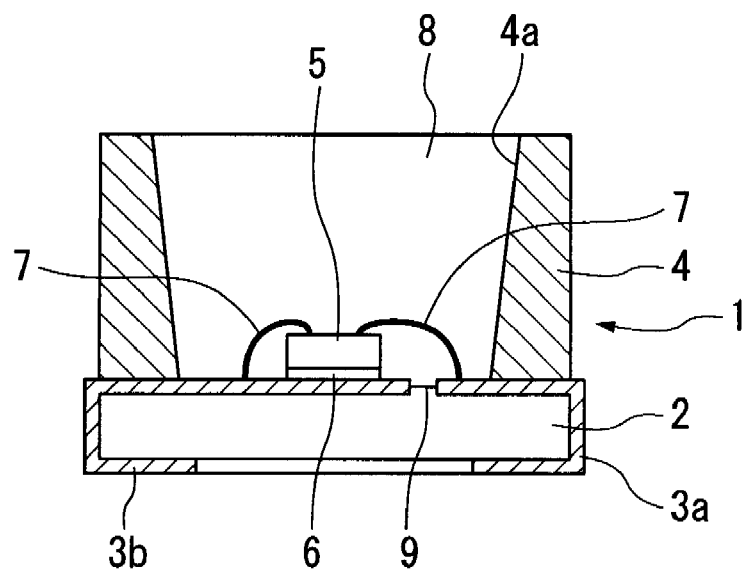
FIG. 1A is a cross-sectional diagram schematically showing an example of a lamp of the present invention.

Herein below, the resin composition for sealing a light-emitting device and the lamp of the present invention will be described in detail.

The resin composition for sealing a light-emitting device of the present invention includes a silsesquioxane resin including two or more oxetanyl groups, an aliphatic hydrocarbon including one or more epoxy groups and a cationic polymerization initiator.

[Silsesquioxane Resin]

As the silsesquioxane resin, those resins having two or more oxetanyl groups are used. Specific examples thereof include a silsesquioxane resin having a cage-type skeleton, represented by the following General Formula (1).

[Formula 1]

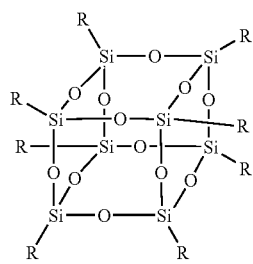
(1)

In the General Formula (1), as long as R has two or more skeletons having oxetanyl groups represented by the following General Formula (2), R may be one kind of structure, or two or more kinds of structures.

[Formula 2]

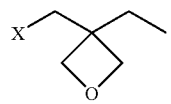
(2)

In the General Formula (2), X is an organic chain between the Si atom of the silsesquioxane and the oxetanyl group, and represents —$(CH_2)_nO$—, —$(CH_2)_n$—, or —$(CH_2)_nCOO$— (n=1 to 6).

Moreover, the skeleton of the silsesquioxane resin may be of a cage-type represented by the following General Formula (3) or (4), a ladder type represented by the following General Formula (5), a random type represented by the following General Formula (6), and a partially cleaved cage-type represented by the following General Formula (7), in addition to a cage-type represented by the General Formula (1).

[Formula 3]

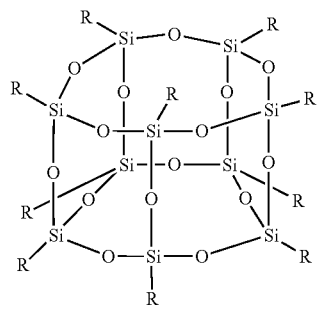
(3)

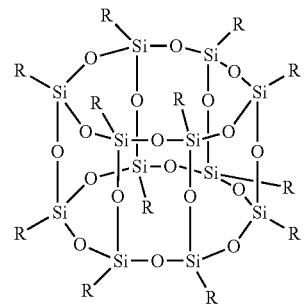
(4)

[Formula 4]

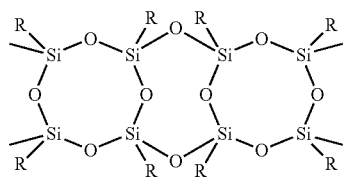
(5)

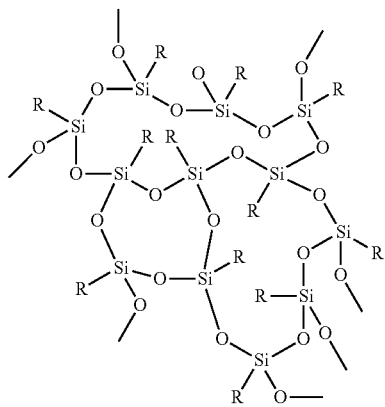
(6)

[Formula 5]

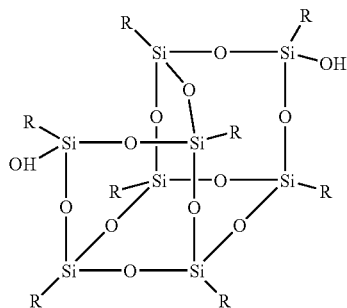

(7)

In the General Formulae (3) to (7), as long as R has two or more skeletons having oxetanyl groups represented by the following General Formula (2), R may be one kind of structure, or two or more kinds of structures.

Furthermore, the skeleton of the silsesquioxane resin may have one kind of structure among the above-mentioned structures, or two or more kinds of structures.

[Aliphatic Hydrocarbon]

As the aliphatic hydrocarbon, those including one or more epoxy groups are preferably used, and those including cyclohexene oxide groups and having 2 or more reactive cyclic ethers are preferred. Examples of the reactive cyclic ethers include an epoxy group and an oxetanyl group, and examples of the aliphatic hydrocarbon including cyclohexene oxide groups and having 2 or more reactive cyclic ethers include a 3,4-epoxycyclohexylcarboxylic acid-3,4-epoxycyclohexylmethyl ester (trade name: Celloxide 2021P (manufactured by Daicel Co., Ltd.)) represented by the following General Formula (8), a 3,4-epoxycyclohexanecarboxylic acid-3-ethyl-3-oxetanylmethylester (manufactured by Showa Denko K.K.) represented by the following General Formula (9), an adipic acid-bis-3,4-epoxycyclohexylmethylester represented by the following General Formula (10), and a diepoxylimonene represented by the following General Formula (11).

[Formula 6]

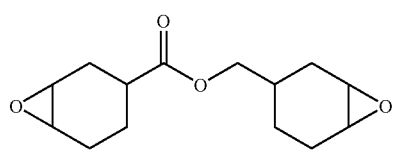

(8)

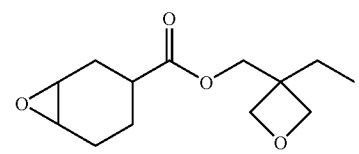

(9)

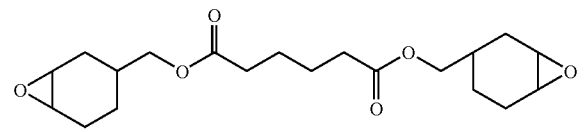

(10)

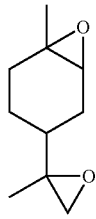

(11)

Furthermore, examples of the aliphatic hydrocarbon including no cyclohexene oxide group, which has 2 or more reactive cyclic ethers include 1,4-butandiol diglycidylether represented by the following General Formula (12), 1,6-hexandiol diglycidylether represented by the following General Formula (13), diethylglycol glycidylether represented by the following General Formula (14), and the like.

[Formula 7]

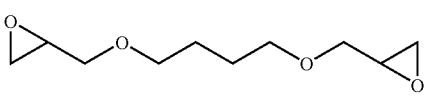

(12)

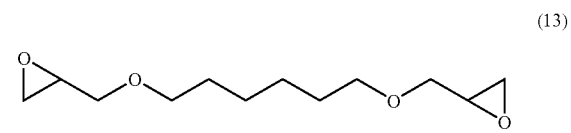

(13)

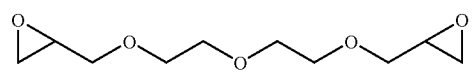

(14)

The content of the aliphatic hydrocarbon in the resin composition for sealing a light-emitting device is preferably in the range of 10% by mass to 60% by mass, more preferably in the range of 20% by mass to 60% by mass, and particularly preferably in the range of 30% by mass to 50% by mass. If the content of the aliphatic hydrocarbon is less than 10% by mass, the sufficient adhesion with a metal may not be obtained in some cases, or cracks upon curing may not be sufficiently prevented in some cases. Furthermore, if the content of the aliphatic hydrocarbon is more than 60% by mass, the light resistance or the heat resistance may not be sufficient in some cases.

[Cationic Polymerization Initiator]

As the cationic polymerization initiator, a thermally latent cationic polymerization initiator can be used, and among them, an onium salt having ion pairs of $PF_6^-$ or $SbF_6^-$ is preferred. Examples of the cationic structure include those represented by the following General Formulae (15) to (17).

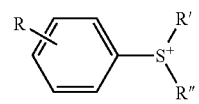

(15)

-continued

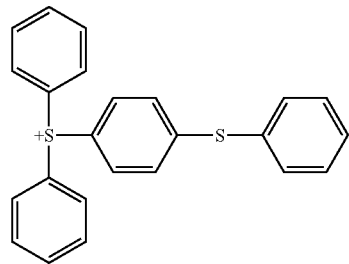

(16)

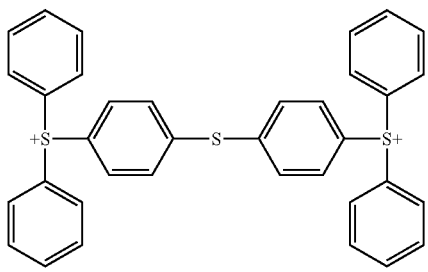

(17)

More specifically, as the cationic polymerization initiator, San-Aid SI series manufactured by Sanshin Chemical Industry Co., Ltd. that are onium salts having ion pairs of $PF_6{-}$ or $SbF_6{-}$, Adeka Optomer CP series or the like can be used.

[Additives]

In addition to the above-described components, if desired, additives such as a phosphor, a light scattering agent, an antioxidant, a UV shielding agent and filler can be added to the resin composition for sealing a light-emitting device of the present invention.

The resin composition for sealing a light-emitting device of the present invention can be prepared by mixing a silsesquioxane resin, an aliphatic hydrocarbon and a cationic polymerization initiator to carry out stirring-defoaming. The viscosity of the resin composition for sealing a light-emitting device can be easily adjusted by varying the compounding ratio of the silsesquioxane resin to the aliphatic hydrocarbon.

The viscosity of the resin composition for sealing a light-emitting device obtained in this manner is in the range of 100 to 5000 mPa·s. If the viscosity is less than 100 mPa·s, the resin composition for sealing a light-emitting device may leak out of the gap between a lead flame and a reflect resin in a package, or the filler may deposit when the filler is added into the resin composition for sealing light-emitting device. In addition, if the viscosity is more than 5000 mPa·s, the resin composition is difficult to discharge by a dispenser during the sealing of the light-emitting device, or air bubbles may be involved into the resin composition.

Since the resin composition for sealing a light-emitting device of the present invention includes the above-described silsesquioxane, aliphatic hydrocarbon and cationic polymerization initiator, the viscosity of the resin composition can be easily adjusted to such a degree that the resin composition is easily discharged by a dispenser, and cracks hardly occur during the curing. In addition, since the resin composition for sealing a light-emitting device of the present invention includes the above-described silsesquioxane, the resin composition has a high surface harness, an excellent light resistance and an excellent adhesion to metals in comparison with the epoxy resins or the silicone resins.

[Lamp]

In the lamp of the present invention, a light-emitting device is sealed with the resin composition for sealing a light-emitting device of the present invention.

Figure 1B:
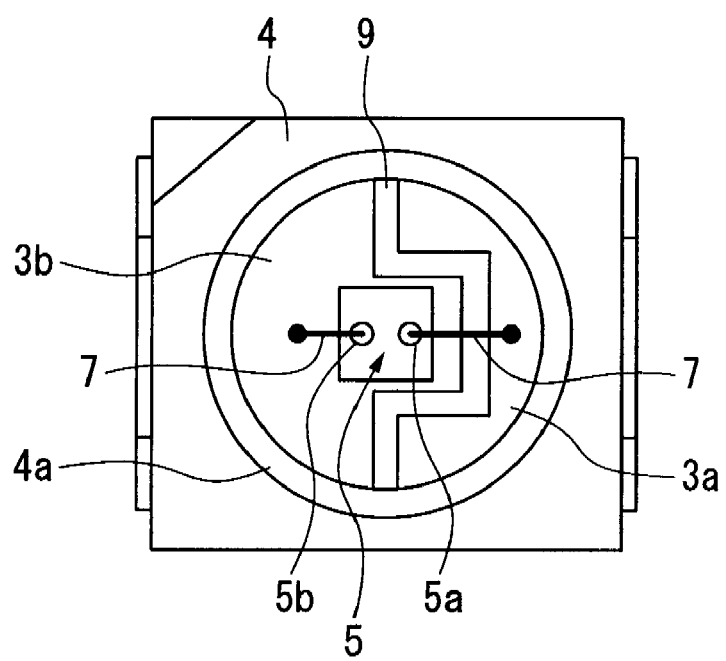
FIG. 1B is a planar diagram schematically showing an example of the lamp of the present invention.

FIG. 1 is a diagram schematically showing an example of the lamp of the present invention. FIG. 1A is a cross-sectional diagram and FIG. 1B is a planar diagram. In FIG. 1A, Symbol 1 denotes a package. This package 1 includes a substrate 2, a first electrode 3a, a second electrode 3b, and a package shaped product 4 including a sealing member 4a as shown in FIGS. 1A and 1B.

As the package shaped product 4, for example, those including a white heat resistance resin composed of polyphthalamide, polyphenylenesulfide or the like is used. Furthermore, the sealing member 4a has a bowl shape (cup shape) in a plane view as shown in FIGS. 1A and 1B, and the first electrode 3a and the second electrode 3b that are electrically insulated by a band-shaped insulating region 9 of the substrate 2 are exposed to the bottom portion of the sealing member 4a, as shown in FIG. 1B. For the first electrode 3a and the second electrode 3b, for example, those obtained by plating a noble metal such as Au and Ag on a base metal such as a Cu or Cu-based alloy, Fe-based alloy, and Ni can be suitably used.

Furthermore, a surface mount LED device 5 is adhered to the second electrode 3b that is exposed to the bottom portion of the sealing member 4a by a die attach paste 6, as shown in FIGS. 1A and 1B. As shown in FIG. 1B, an anode bonding pad 5a and a cathode bonding pad 5b that are each composed of Au, Al, Ni, Cu, or the like, are provided in LED device 5 and electrically connected with the first electrode 3a and the second electrode 3b through wires 7 and 7 composed of Au, Al or the like. Furthermore, the resin composition 8 for sealing a light-emitting device of the present invention is filled and sealed in the sealing member 4a.

For the lamp shown in FIG. 1, sealing of the LED device 5 is done by a method including discharging liquid droplets of the resin composition 8 for sealing a light-emitting device of the present invention by a dispenser thereby filling into the sealing member 4a, and curing the resin composition 8 for sealing a light-emitting device by heating.

The thermal curing temperature as used herein can be from 120° C. to 180° C., and the thermal curing time can be from 2 to 6 hours. In addition, the thermal curing as used herein may be, for example, a two-step heat treatment including a first heat treatment for carrying out heat treatment at a low temperature for a short period of time, and a second heat treatment for carrying out heat treatment at a higher temperature for a longer period of time than the first heat treatment. In this case, the heat treatment temperature for the first heat treatment can be from 70° C. to 100° C., and the heat treatment time can be from 10 minutes to 2 hours. Further, the heat treatment temperature for the second heat treatment can be from 120° C. to 180° C., and the heat treatment time can be from 2 hours to 6 hours. If the thermal curing temperature is higher than 180° C., the white resin of the reflector of the package shaped product 4 may be colored in some cases, whereas if the thermal curing temperature is lower than 120° C., the curing may be insufficient in some cases.

In the lamp of the present invention, since the LED device 5 is sealed with the resin composition 8 for sealing a light-emitting device of the present invention, the resin composition can be easily discharged by a dispenser, thereby efficiently sealing the light-emitting device. Therefore, the lamp of the present invention is excellent in productivity. Furthermore, in the lamp of the present invention, since the LED device 5 is sealed with the resin composition 8 for sealing a light-emitting device of the present invention, which has a high surface hardness, an excellent light resistance and an excellent adhesion to metals, the lamp has high reliability.

EXAMPLES

Example 1

The components as described below were mixed, and the stirring-defoaming process was carried out at 1200 rpm for 5 mins to prepare a resin composition of Example 1.
<Components>
Oxetanyl silsesquioxane (trade name: OX-SQSi-20 (manufactured by Toagosei Co., Ltd.)) as the silsesquioxane resin: 60 parts by weight;
Alicyclic epoxy (trade name: Celloxide 2021P (manufactured by Daicel Co., Ltd.)) as the aliphatic hydrocarbon: 40 parts by weight;
Cationic polymerization initiator (trade name: San-Aid SI-100 L (manufactured by Sanshin Chemical Industry Co., Ltd.)): 0.1 parts by weight;
The oxetanyl silsesquioxane used in Example 1 has a structure represented by the following General Formula (18), and it is a mixture of the skeletons of a cage-type, a ladder type, a random type, and a partially cleaved cage-type.

[Formula 9]

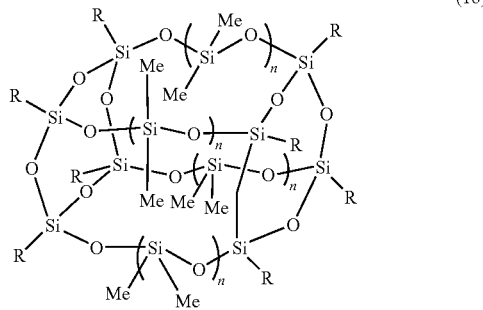

(18)

In the General Formula (18), Me represents a methyl group.

Example 2

The resin composition of Example 2 was prepared by mixing the following components in the same manner as Example 1.
<Components>
Oxetanyl silsesquioxane (trade name: OX-SQH (manufactured by Toagosei Co., Ltd.)) as the silsesquioxane resin: 60 parts by weight;
3,4-epoxy cyclohexanecarboxylic acid-3-ethyl-3-oxetanyl methyl ester (manufactured by Showa denko K.K.)) as the aliphatic hydrocarbon: 40 parts by weight;
Cationic polymerization initiator (trade name: San-Aid SI-100 L (manufactured by Sanshin Chemical Industry Co., Ltd.)): 0.1 parts by weight;
The oxetanyl silsesquioxane used in Example 2 is a mixture of the skeletons of a cage-type, a ladder type, a random type, and a partially cleaved cage-type.

As described below, the lamp shown in FIG. 1 was obtained by sealing an LED device using the resin compositions of Examples 1 and 2 obtained in this manner.

That is, the die attach paste 6 was applied on the second electrode 3b that was exposed to the bottom portion of the sealing member 4a of the package shaped product 4 formed of a polyphthalamide, as shown in FIG. 1, and a surface mount LED device 5 was arranged on the die attach paste 6. Thereafter, the surface mount LED device 5 was adhered on the bottom portion of the sealing member 4a by heating it at 150° C. for 1 hour to cure the die attach paste 6. Thereafter, by carrying out the wire bonding, the anode bonding pad 5a and the cathode bonding pad 5b of the LED device 5 were electrically connected with the first electrode 3a and the second electrode 3b via the wires 7, 7.

Then, as the first electrode 3a and the second electrode 3b, those formed of Cu plated with Ag were used, and as the wires 7, 7, those formed of Au were used.

Then, the liquid droplets of the resin composition 8 of Examples 1 and 2 were discharged into the sealing member 4a by a dispenser, and filled therein, the resin composition 8 was cured by sequentially carrying out a heat treatment at 80° C. for 1 hour (a first heat treatment) and a heat treatment at 150° C. for 3 hours (a second heat treatment) in an oven, and the sealing was completed to obtain the lamps as shown in FIG. 1.

Also, the dispenser as used herein was a dispenser of a flow rate-regulating type in which a liquid sample is put into a syringe equipped with a needle, and discharged using a compressed air from a dispense controller, thereby controlling the pressure and the discharging time.

Comparative Example 1

The resin composition of Comparative Example 1 was prepared by mixing the following components in the same manner as Example 1.
<Components>
Solution of EG6301A (trade name (manufactured by Dow Corning Toray Co., Ltd.)): 100 parts by weight;
Solution of EG6301B (trade name (manufactured by Dow Corning Toray Co., Ltd.)): 100 parts by weight;
Thereafter, the lamp shown in FIG. 1 was obtained in the same manner as Example 1 except that the resin composition of Comparative Example 1 was used and heat-cured by performing a heat treatment at a temperature of 150° C. for 1 hour.

Comparative Example 2

The resin composition of Comparative Example 2 was prepared by mixing the following components in the same manner as Example 1.
<Components>
Oxetanyl silsesquioxane (trade name: OX-SQ (manufactured by Toagosei Co., Ltd.)) as the silsesquioxane resin: 100 parts by weight;
Cationic polymerization initiator (trade name: San-Aid SI-100 L (manufactured by Sanshin Chemical Industry Co., Ltd.)): 1 part by weight;
The oxetanyl silsesquioxane used in Comparative Example 2 was a mixture of the skeletons of a cage-type, a ladder type, a random type, and a partially cleaved cage-type.

Thereafter, the lamp shown in FIG. 1 was obtained in the same manner as Example 1 except that the resin composition of Comparative Example 2 was used.

Comparative Example 3

The lamp shown in FIG. 1 was obtained in the same manner as Example 1 except that a cycloaliphatic epoxy composition was used and heat-cured by performing a heat treatment at a temperature of 130° C. for 4 hours.

In addition, the cycloaliphatic epoxy composition of Comparative Example 3 included a bisphenol A represented by the following General Formula (19), a cycloaliphatic epoxy represented by the following General Formula (20) and an acid anhydride (methyl HHPA) represented by the following General Formula (21), wherein one equivalent of the acid anhydride was included with respect to the epoxy resin composed of the bisphenol A and cycloaliphatic epoxy.

[Formula 10]

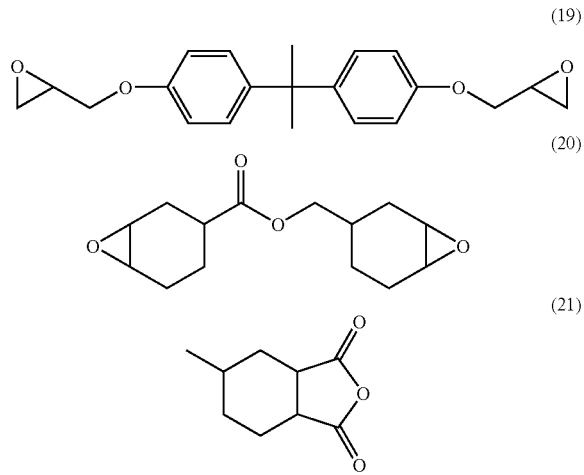

The following items of the lamps obtained in Examples 1 and 2, and Comparative Examples 1 to 3 in this manner were measured and evaluated as follows. The results are shown in Table 1.

TABLE 1

| | Ex. 1 | Ex. 2 | Comp. Ex. 1 | Comp. Ex. 2 | Comp. Ex. 3 |
|---|---|---|---|---|---|
| Evaluation of dispensing | Good | Good | Good | Bad | Good |
| Evaluation of surface tack | Good | Good | Bad | Good | Good |
| Evaluation of cracking prevention | Good | Good | Good | Bad | Good |
| Evaluation of surface hardness | Good | Good | Bad | Good | Good |
| Evaluation of adhesion | Good | Good | Bad | Good | Good |
| Evaluation of light resistance | Good | Good | Good | Unadministered | Bad (Turned yellow) |
| Initial total radiant flux | 18 mW | 18 mW | 18 mW | 16 mW | 17 mW |

[Evaluation of Dispensing]

The kinetic viscosity of the resin composition was measured using a rheometer, and then multiplied by a density to be converted into a viscosity. If the viscosity calculated in this manner is less than 5000 mPa·s, the evaluation of dispensing was determined to be "good", if the viscosity is 5000 mPa·s or more, the evaluation of dispensing was determined to be "bad".

[Evaluation of Cracking Prevention]

The surface of the obtained lamp was visually observed, and the occurrence of the cracks in the sealing resin was investigated. As a result, in the case where cracks were not present, the evaluation of cracking prevention was evaluated as "good", and in the case where cracks were present, the evaluation of cracking prevention was evaluated as "bad".

[Evaluation of Surface Hardness]

The shore A hardness was measured using a durometer (type of A), and the resin composition, of which the shore A hardness exceeded the measurement range (A 90) was evaluated as "good", while the resin composition, of which the shore A hardness was within the measurement range (A30 to A90) was evaluated as "bad".

[Evaluation of Adhesion]

The lamp obtained was visually observed, and detachment of the sealing resin from the first electrode 3a, second electrode 3b, wires 7 and 7 was investigated. As a result, in the case where detachment was present between the sealing resin and the first electrode 3a, second electrode 3b or wires 7 and 7, the lamp was evaluated as "good", while in the case where detachment was not present between the sealing resin and the first electrode 3a, second electrode 3b or wires 7 and 7, the lamp was evaluated as "bad".

[Initial Total Radiant Flux]

The initial total radiant flux was measured using a total flux measurement device.

As shown in Table 1, in Example 1 and Example 2, the evaluations of all items were "good". More specifically, in Example 1 and Example 2, since the crosslink density and hardness were high due to the 3-dimensional crosslink, the evaluation of surface hardness was considered "good". In addition, in Example 1 and Example 2, since the cationic polymerization-based unreacted monomer hardly remained on the surface, the evaluation of surface tack was considered "good". In addition, in Example 1 and Example 2, since the adhesion force was strong and the thermal expansion was small, detachment was not observed, thereby the evaluation of adhesion was considered "good". In addition, in Example 1 and Example 2, the initial total radiant fluxes showed an excellent result of 18 mW.

Figure 2:
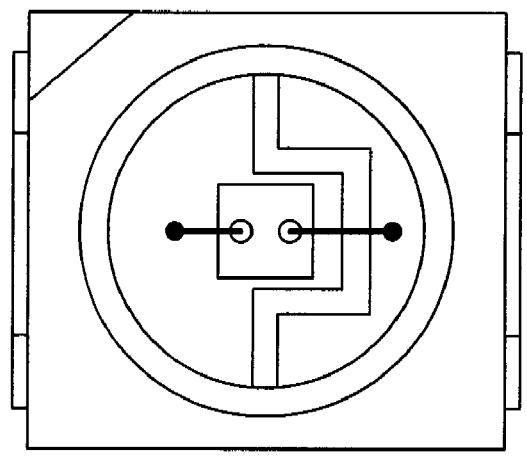
FIG. 2 is an overhead view of the lamp of Example 1.

FIG. 2 is an overhead view of the lamp of Example 1. As shown in FIG. 2, in Example 1, no cracks occurred in the sealing resin.

In contrast, in Comparative Example 1, since the silicone rubber had a high free volume and was soft, the evaluation of surface hardness was considered "bad". In addition, in Comparative Example 1, since the uncross-linked oil tends to remain on the surface of the silicone rubber caused by the properties thereof, the evaluation of surface hardness was considered "bad". In addition, in Comparative Example 1, since the silicone had a low adhesion and a large thermal expansion, detachment easily occurred, and as a result, the evaluation of adhesion was considered "bad".

Figure 3:
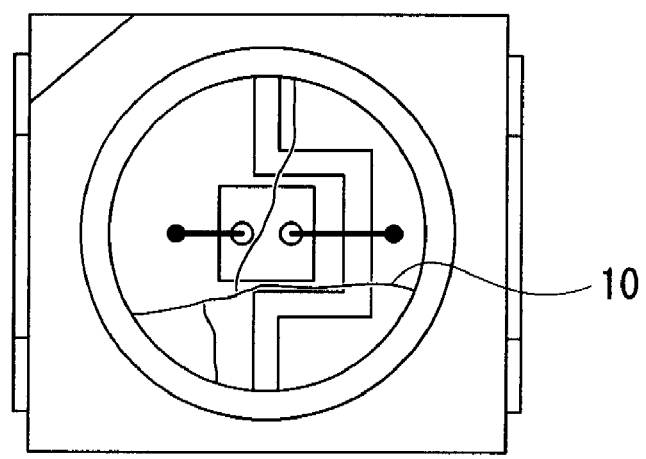
FIG. 3 is an overhead view of the lamp of Example 2.
The reference symbols shown in these figures are defined as follows:
1 . . . package, 2 . . . substrate, 3a . . . first electrode, 3b . . . second electrode, 4 . . . package shaped product, 4a . . . sealing member, 5 . . . LED device, 6 . . . die attach paste, 7 . . . wire, 10 . . . crack

Furthermore, since the aliphatic hydrocarbon was not included in the resin composition of Comparative Example 2, the evaluation of dispensing and the evaluation of crack was considered "bad". In addition, FIG. 3 is an overhead view of the lamp of Example 2. As shown in FIG. 3, in the lamp of Comparative Example 2, cracks 10 occurred in the sealing resin.

Furthermore, in Comparative Example 2, the initial total radiant flux was 16 mW, Which is lower than the initial total radiant fluxes of Example 1 and Example 2, because the scattering of light occurred by the air bubble remained in the inside of the sealing resin.

Furthermore, in Comparative Example 3 in which the silsesquioxane resin and cationic polymerization initiator were not included in the resin composition, the resin composition turned yellow, and thereby the evaluation of light resistance was considered "bad". In addition, in Comparative Example 3, the initial total radiant flux was 17 mW, which is lower than the initial total radiant fluxes of Examples 1 and 2, because the transparency of the resin composition was low.

INDUSTRIAL APPLICABILITY

According to the present invention, there can be provided a resin composition for sealing a light-emitting device, in which the viscosity of the resin composition can be easily adjusted to such a degree that the resin composition is easily discharged by a dispenser, cracks hardly occur during the curing, the surface hardness is high, the light resistance is excellent and the adhesion to metals is excellent, and a lamp with a high reliability. Therefore, the present invention is industrially useful.

The invention claimed is:

1. A resin composition for sealing a light-emitting device comprising:
    a silsesquioxane resin including two or more oxetanyl groups;
    an aliphatic hydrocarbon including one or more epoxy groups; and
    a cationic polymerization initiator.

2. The resin composition for sealing a light-emitting device according to claim 1,
    wherein
    the aliphatic hydrocarbon is included at 10% to 60% by mass.

3. The resin composition for sealing a light-emitting device according to claim 1,
    wherein
    the aliphatic hydrocarbon includes a cyclohexene oxide group.

4. The resin composition for sealing a light-emitting device according to claim 1,
    wherein
    the viscosity of the resin composition is in the range of 100 mPa·s to 5000 mPa·s.

5. A lamp comprising:
    a package equipped with a cup-shaped sealing member,
    an electrode exposed in the bottom portion of the cup-shaped sealing member, and
    a light-emitting device arranged on the bottom portion and electrically connected with the electrode, wherein
        the light-emitting device is sealed with the resin composition for sealing a light-emitting device of claim 1, which is filled in the cup-shaped sealing member.

* * * * *